US012727487B2

(12) United States Patent
Abdul Aziz et al.

(10) Patent No.: US 12,727,487 B2
(45) Date of Patent: Sep. 1, 2026

(54) PACKAGE WITH SOLDER MASK

(71) Applicant: NXP USA, Inc., Austin, TX (US)

(72) Inventors: Aznita Abdul Aziz, Puchong (MY); Nor Azhan Bin Mahmood, Selangor (MY)

(73) Assignee: NXP USA, Inc., Austin, TX (US)

( * ) Notice: Subject to any disclaimer, the term of this patent is extended or adjusted under 35 U.S.C. 154(b) by 756 days.

(21) Appl. No.: 18/057,247

(22) Filed: Nov. 21, 2022

(65) Prior Publication Data

US 2024/0170438 A1 May 23, 2024

(51) Int. Cl.

*H10W 70/05* (2026.01)
*H10W 70/65* (2026.01)
*H10W 72/00* (2026.01)
*H10W 72/30* (2026.01)
*H10W 90/00* (2026.01)

(52) U.S. Cl.

CPC ......... *H10W 70/097* (2026.01); *H10W 70/65* (2026.01); *H10W 72/01308* (2026.01);
(Continued)

(58) Field of Classification Search

CPC ..... H01L 24/32; H01L 21/4864; H01L 24/27; H01L 24/29; H01L 24/48; H01L 24/73; H01L 24/83; H01L 2224/26175; H01L 2224/27013; H01L 2224/29139; H01L 2224/2919; H01L 2224/32227; H01L 2224/48227; H01L 2224/73265; H01L 2224/83007; H01L 2224/83022; H01L 2224/83862; H01L 2924/364; H01L 2224/8385; H01L 24/85; H10W 70/097; H10W 70/65; H10W 72/01308; H10W 72/01371; H10W 72/07302; H10W 72/07311; H10W 72/07338; H10W 72/352; H10W 72/354; H10W 72/387;
(Continued)

(56) References Cited

U.S. PATENT DOCUMENTS 6,252,307 B1 * 6/2001 Appelt .................. B82Y 30/00 257/784
6,448,507 B1 9/2002 Fontecha et al.
(Continued)

OTHER PUBLICATIONS

Burmeister, Martin et al.; "Preventing Adhesive Resin Bleed in Microelectronics Assembly through Gas Plasma Technology"; ResearchGate; 8 pages (Jan. 2005).
(Continued)

*Primary Examiner* — Jessica S Manno
*Assistant Examiner* — Bipana Adhikari Dawadi
(74) *Attorney, Agent, or Firm* — Andrew C. Milhollin

(57) ABSTRACT

An electronic device package may include a solder mask that is positioned to mitigate leakage of resin or other adhesive material from the region of a die and die bond pad onto other surfaces of the package, such as surfaces of wire bond pads. One or more wire bond pads of the package may be formed from the same conductive layer as the die bond pad, and the solder mask may be positioned over a portions of the conductive layer located directly between such wire bond pads and the die bond pad. The solder mask may include portions disposed at one or more sides of the die bond pad. The solder mask may be formed over the package substrate prior to attachment of the die to the die bond pad.

13 Claims, 3 Drawing Sheets

(52) U.S. Cl.
CPC ............................ *H10W 72/01371* (2026.01); *H10W 72/07302* (2026.01); *H10W 72/07311* (2026.01); *H10W 72/07338* (2026.01); *H10W 72/352* (2026.01); *H10W 72/354* (2026.01); *H10W 72/387* (2026.01); *H10W 72/884* (2026.01); *H10W 90/734* (2026.01); *H10W 90/754* (2026.01)

(58) Field of Classification Search
CPC ............. H10W 72/884; H10W 90/734; H10W 90/754; H10W 70/687; H10W 72/075; H10W 72/07337
See application file for complete search history.

(56) References Cited

U.S. PATENT DOCUMENTS 10,317,796 B2 * 6/2019 Higuchi .................. G03F 7/168
2003/0119226 A1 * 6/2003 Appelt .................... H01L 24/49 438/106
2007/0272940 A1 * 11/2007 Lee ...................... H10H 20/857 257/E23.071
2013/0109136 A1 * 5/2013 Foote ...................... H01L 24/83 438/115

OTHER PUBLICATIONS

Neff, B. et al; "No-Bleed Die Attach Adhesives"; IEEE Xplore; 3 pages; (May 23, 2005).
Zhang, Rongwei et al; "Solutions for Controlling Resin Bleed Out"; Retrieved from internet (file:///C:/Users/nxf94684/Downloads/Solutions%20for%20controlling%20resin%20bleed%20out.pdf); Semiconductor Digest; 10 pages (Dec. 2017).
Capili, Michael D.; "Understanding and Controlling Resin Bleed Out"; International Research Journal of Advanced Engineering and Science; vol. 4, Issue4, p. 196-197; 2019.

* cited by examiner

PACKAGE WITH SOLDER MASK

TECHNICAL FIELD

Embodiments of the subject matter described herein relate generally to electronic device packages, and, more specifically, to electronic device packages having solder masks for mitigating die-attach adhesive bleed out.

BACKGROUND

Resin bleed out (RBO) is commonly encountered when performing adhesive-based die-attach in electronic device packages. When RBO occurs, resin between a given die and the surface to which the die is being bonded leaks out, exceeding the boundaries of the die and contaminating other surfaces of the package, resulting in degraded bonding quality.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, an electronic device package may include a package substrate, a conductive layer disposed on the package substrate, and a solder mask disposed over the package substrate. The conductive layer may include a die bond pad, at least one wire bond pad, and a conductive region coupled between the die bond pad and the at least one wire bond pad. A first portion of the solder mask may be disposed directly on the conductive region of the conductive layer.

In one or more embodiments, the electronic device package may include adhesive material disposed on the die bond pad. The solder mask may be positioned to mitigate leakage of the adhesive material from the die bond pad onto the at least one wire bond pad.

In one or more embodiments, the adhesive material comprises electrically conductive epoxy.

In one or more embodiments, the electronic device package may include a die attached to the die bond pad via the adhesive material, and a wire bond coupled between the at least one wire bond pad and at least one corresponding wire bond pad disposed on the die. The wire bond may overlap the first portion of the solder mask.

In one or more embodiments, the first portion of the solder mask may be disposed between a first surface of the die bond pad and a second surface of the at least one wire bond pad.

In one or more embodiments, the first portion of the solder mask may have a width of between 0.1 mm and 0.2 mm.

In one or more embodiments, the solder mask comprises non-electrically-conductive epoxy material.

In an example embodiment, a package may include a package substrate, a die bond pad disposed on the package substrate, at least one wire bond pad disposed on the package substrate and coupled to the die bond pad, and a solder mask having a first portion disposed between a first surface of the die bond pad and a second surface of the at least one wire bond pad. The solder mask may be positioned to block leakage of adhesive material from the first surface of die bond pad to the second surface of the at least one wire bond pad.

In one or more embodiments, the package may further include a conductive layer formed on the package substrate. The conductive layer may include the die bond pad, the at least one wire bond pad, and a conductive region that connects the die bond pad to the at least one wire bond pad.

In one or more embodiments, the first portion of the solder mask may be disposed directly on the conductive region of the conductive layer.

In one or more embodiments, the adhesive material may include electrically conductive silver epoxy.

In one or more embodiments, the first portion of the solder mask may have a width of between 0.1 mm and 0.2 mm.

In one or more embodiments, the package may further include a die that is attached to the die bond pad via the adhesive material.

In one or more embodiments, the package may further include at least one wire bond that connects the at least one wire bond pad to at least one corresponding wire bond pad on the die.

In one or more embodiments, the solder mask may include non-electrically-conductive epoxy material.

In an example embodiment, a method of fabricating an electronic device package may include steps of forming a die bond pad and a plurality of wire bond pads on a package substrate of the electronic device package, forming a solder mask between the plurality of wire bond pads and the die bond pad, and attaching a die to the die bond pad using adhesive material. The solder mask may be positioned to prevent leakage of the adhesive material from the die bond pad onto the plurality of wire bond pads.

In one or more embodiments, forming the die bond pad and the plurality of wire bond pads may include forming a conductive layer that includes the die bond pad, the plurality of wire bond pads, and a plurality of conductive regions that connect the die bond pad to the plurality of wire bond pads.

In one or more embodiments, portions of the solder mask are formed directly on the plurality of conductive regions.

In one or more embodiments, the method may further include a step of performing plasma cleaning of the package substrate after forming the solder mask and before attaching the die to the die bond pad.

In one or more embodiments, the method may further include steps of curing the adhesive material and attaching wire bonds connecting the plurality of wire bond pads to a second plurality of wire bond pads on the die.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
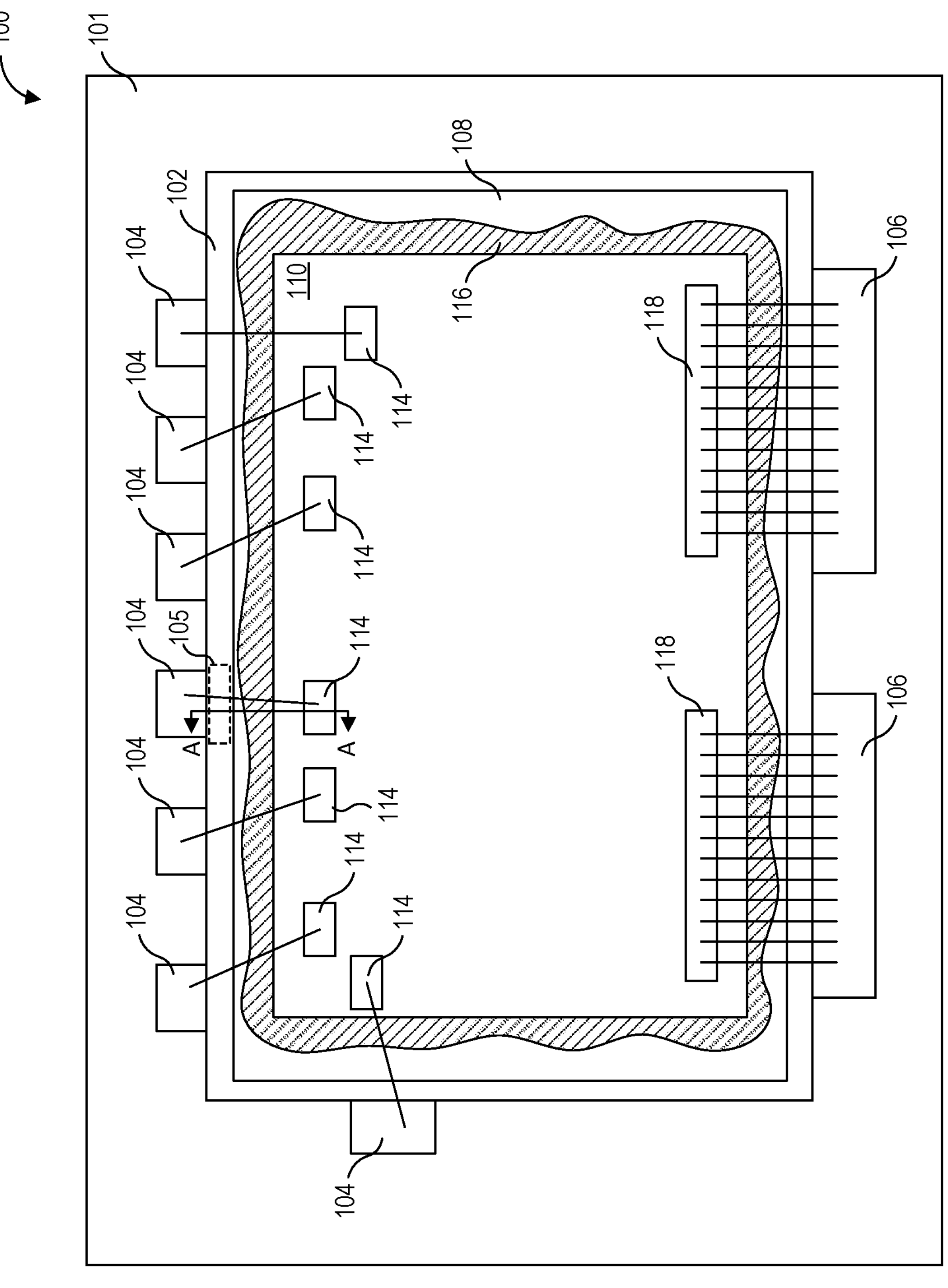
FIG. 1 is a top-down view of an example package that includes a solder mask disposed around a die bond pad, which mitigates resin or other adhesive bleed out between the die bond pad and other conductive surfaces of the package, according to an embodiment.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

In conventional electronic device packages, die attach adhesives used to attach a die to a die bond pad may bleed (i.e., leak) out from the die bond pad onto other package surfaces, such as wire bond pads. This issue is sometimes referred to as resin bleed out (RBO). The leakage of die attach adhesives may occur at the time the die is attached to the die bond pad or at a subsequent thermal curing step. As package form factors are reduced, clearances around die bond pads are reduced, making the issue of RBO becomes more critical.

RBO may negatively impact bond quality of wire bonds at wire bond pads that have been contaminated with die attach adhesive. For example, if die attach adhesive leaks onto a given wire bond pad, discoloration of the wire bond pad and fishtailing of wire bonds stitches at the wire bond pad may undesirably occur. Additionally, if plasma cleaning is used to remove contaminants from an electronic device package prior to attachment of the die to the die bond pad, this may result in increased surface energy at the die bond pad and other surfaces of the package, which may exacerbate die attach adhesive leakage/RBO.

Embodiments here relate to electronic device packages that include a solder mask positioned mitigate die attach adhesive leakage onto sensitive package surfaces, such as the surfaces of wire bond pads. A given package may include a die bond pad and multiple wire bond pads in addition to the solder mask. At least a portion of the solder mask may be disposed between the surface of the die bond pad and surfaces of the wire bond pads to block or otherwise reduce the flow of adhesive material from the surface of the die bond pad onto the surfaces of the wire bond pads. In one or more embodiments, at least one wire bond pad may be formed from the same conductive layer as that of the die bond pad, where the wire bond pad and the die bond pad are coupled (e.g., electrically and physically coupled or directly connected) together via an intermediary conductive region of the conductive layer that extends between the wire bond pad and the die bond pad. At least a portion of the solder mask may be formed directly on (e.g., in direct contact with) this intermediary conductive region. In one or more embodiments, the solder mask may be disposed at one or more (e.g., up to and including all) sides of the die bond pad. In one or more embodiments, the solder mask may include non-electrically-conductive material, such as epoxy (e.g., thermosetting polymer material), ink (e.g., photoimageable liquid ink), film (e.g., photoimageable dry film), or a combination of these. In one or more embodiments, the die attach adhesive material may include electrically conductive material, such as silver epoxy as a non-limiting example.

By positioning a solder mask over the substrate of an electronic device package to block the flow of die attach adhesive from a die bond pad onto wire bond pads of the package, as described in accordance with various embodiments herein, die attach adhesive material leakage (e.g., RBO) and associated problems such as wire bond stitch fishtailing and discoloration may be advantageously mitigated or prevented. When manufacturing the electronic device package, this may additionally allow for substrate cleaning techniques, such as plasma cleaning, to be performed prior to die attach, at least because the impact of the surface energy increase (attributable to the substrate cleaning) on subsequent die attach adhesive leakage may be offset by the mitigation of such die attach adhesive leakage provided by the solder mask.

FIG. 1 shows an example package 100 (sometimes referred to as the "electronic device package 100") that includes a solder mask 102 for mitigating bleed out of resin or other adhesive materials occurring at or around a die bond pad 108. The example package 100 may include the solder mask 102, wire bond pads 104, wire bond pads 106, and the die bond pad 108, each formed on a substrate 101. A die 110, may be attached to the die bond pad 108 using adhesive material 116. The die 110 may include wire bond pads 114 and wire bond pads 118 at various locations on its surface.

The substrate 101 may be a printed circuit board (PCB) substrate, which may be a multi-layer substrate including alternating layers of dielectric material (e.g., epoxy resin material, glass fabric composite material, and/or the like) and layers (e.g., patterned layers) of electrically conductive material (e.g., copper, nickel, gold, aluminum, or the like, or any suitable combination thereof) in one or more embodiments. In such multi-layer PCBs, one or more of the layers of conductive material may be connected to one another using through substrate vias (TSVs) that extend through one or more intervening layers of dielectric material.

The wire bond pads 104, the wire bond pads 106, and the die bond pad 108 may each be formed from conductive material such as copper, gold, nickel, aluminum, or a combination thereof (as non-limiting examples), that is disposed on the upper surface of the substrate 101. In one or more embodiments, the wire bond pads 106 and the die bond pad 108 may be coupled to a ground potential (i.e., a ground voltage) or other reference potential. For example, the wire bond pads 106 and the die bond pad 108 may be coupled to a reference plane or a ground plane of the substrate 101 that is biased to a ground potential or a reference potential. The wire bond pads 106 and the die bond pad 108 may be coupled to such a reference plane or ground plane by one or more through-substrate vias (not shown) that may extend through one or more layers of the substrate 101. In one or more embodiments, the wire bond pads 104 may be formed from the same conductive layer as the die bond pad 108. In one or more embodiments, the conductive layer that includes the wire bond pads 104 and the die bond pad 108 may be contiguous between the wire bond pads 104 and the die bond pad 108, such that the die bond pad 108 is electrically coupled to each of the wire bond pads 104. The wire bond pads 106 may be separate from (e.g., not directly electrically coupled to or in direct contact with) the die bond pad 108.

In one or more embodiments, the die 110 may be a semiconductor die (e.g., a gallium nitride (GaN) die, a silicon carbide (SiC) die, a GaN-on-SiC die, a silicon (Si) die, a gallium arsenide (GaAs) die, or another suitable type of semiconductor die. The wire bond pads 114 and the wire bond pads 118 may be formed from conductive material such as copper, gold, nickel, aluminum, or a combination thereof (as non-limiting examples), that is formed on an upper surface of the die 110. The die 110 may be attached to the die bond pad 108 via adhesive material 116. The adhesive material 116 may include resin, epoxy, solder, or another suitable adhesive material. For example, the adhesive material 116 may include conductive adhesive material (e.g., silver epoxy as a non-limiting example) that electrically couples a backside of the die 110 to the die bond pad 108.

In one or more embodiments, the die 110 may be an amplifier die that includes one or more amplifier devices (e.g., in a class AB amplifier configuration, a Doherty amplifier configuration, a multi-stage Doherty configuration, or another applicable amplifier configuration). In one or more such embodiments, connections between such amplifier devices and ground may be provided via the wire bond pads 114, the wire bond pads 104, and wire bonds (e.g., the wire bond 202 of FIG. 2) connected therebetween. In one or more such embodiments, connections between such amplifier devices and signal inputs and outputs may be provided via the wire bond pads 106, the wire bond pads 118, and wire bonds connected therebetween. For example, the wire bond pads 106 may be coupled to a signal source (e.g., a radio frequency (RF) signal source) or a resistive load (e.g., an antenna) as non-limiting examples.

The solder mask 102 may be disposed at one or more sides of the die bond pad 108 (e.g., surrounding the die bond pad 108) and may be positioned to block excess adhesive material from of the adhesive material 116 from bleeding (i.e., leaking) onto sensitive surfaces of the package 100, such as surfaces of the wire bond pads 104 or surfaces of the wire bond pads 106. The solder mask 102 may include non-electrically-conductive material, such as epoxy (e.g., thermosetting polymer material), ink (e.g., photoimageable liquid ink), film (e.g., photoimageable dry film), or any suitable combination of these.

In one or more embodiments, portions of the solder mask 102, such as a portion 105 of the solder mask 102, may be disposed between the surface of the die bond pad 108 and surfaces of the wire bond pads 104, 106, thereby blocking the flow of the adhesive material 116 onto the surfaces of the wire bond pads 104, 106. In one or more embodiments, the wire bond pads 104 and the die bond pad 108 may be formed from the same conductive layer (e.g., the conductive layer 208 of FIG. 2), the die bond pad 108 may be coupled (e.g., directly connected) to each of the wire bond pads 104 by intermediary conductive regions (e.g., the intermediary conductive region 204 of FIG. 2) of the conductive layer that extend between the die bond pad 108 and each of the wire bond pads 104. In one or more embodiments, portions of the solder mask 102, such as the portion 105, may be disposed directly on such intermediary conductive regions of the conductive layer.

Without the solder mask 102, the adhesive material 116 may spread onto the wire bond pads 104 or the wire bond pads 106 when attaching the die 110 to the die bond pad 108 or when subsequently thermally curing the adhesive material 116. Contamination wire bond pads such as the wire bond pads 104 or the wire bond pads 106 by the adhesive material 116 may then cause discoloration of such bond pads and may negatively affect the surfaces of such wire bond pads such that non-idealities (e.g., "fish-tailing") may occur when subsequently attaching wire bonds to the wire bond pads. By blocking or otherwise mitigating leakage of the adhesive material 116 onto surfaces of the wire bond pads 104 or the wire bond pads 106, the solder mask 102 may advantageously prevent or mitigate degradation of such wire bond pads and improve the quality of wire bond stitches occurring at those wire bond pads.

The extent to which die attach adhesives would typically spread beyond the boundaries of a given die bond pad of a conventional electronic device package that lacks any form of die attach adhesive leakage/RBO mitigation may be undesirably increased by cleaning the substrate of the conventional package prior to the die attach step. In contrast, by blocking or otherwise mitigating leakage of the adhesive material 116 with the solder mask 102, substrate cleaning processes (e.g., plasma cleaning processes) may be performed to clean the substrate 101 prior to attaching the die 110 to the die bond pad 108 without significantly increasing the risk of contaminating the wire bond pads 104, 106 or other sensitive surfaces of the package 100.

Figure 2:
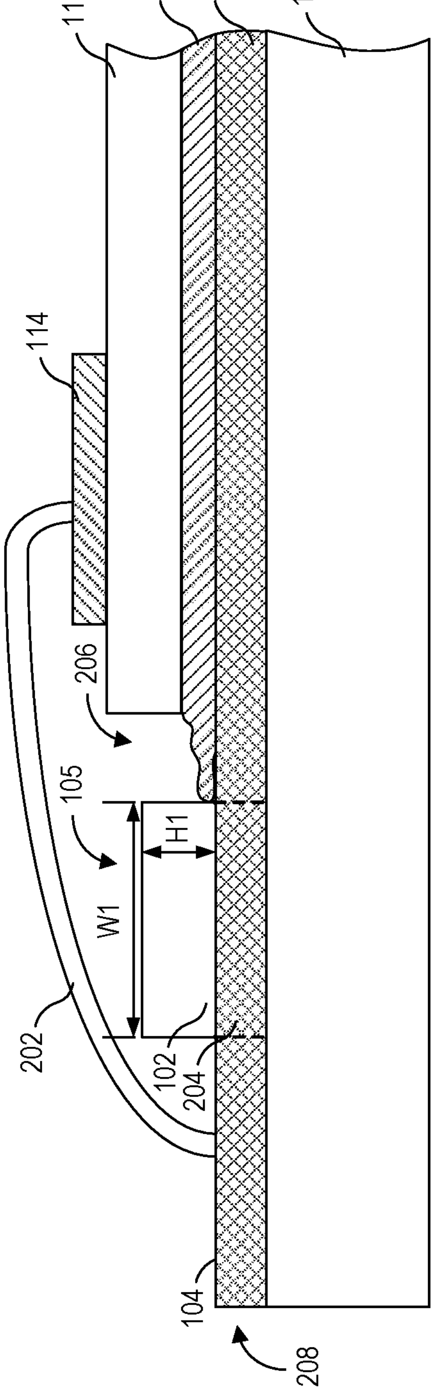
FIG. 2 is a cross-sectional side view of the example package of FIG. 1 along the line A-A, according to an embodiment.

FIG. 2 shows a cross-sectional view 200 of a portion of the package 100 of FIG. 1, which illustrates placement of the solder mask 102 relative to other elements of the package 100, in accordance with one or more embodiments. The cross-section shown in FIG. 2 is taken along the line A-A of the top-down view shown in FIG. 1. Like reference numerals may be used herein to refer to like elements of FIGS. 1 and 2, and aspects of one or more such elements already described above may not be repeated here for the sake of brevity.

As shown, the substrate 101 may include an upper surface on which a conductive layer 208 is formed. The conductive layer 208 may include the die bond pad 108, a wire bond pad 104, and an intermediary conductive region 204 that is coupled directly between (e.g., that directly electrically and physically connects) the wire bond pad 104 and the die bond pad 108. Though not shown in the view 200, it should be understood that the conductive layer 208 may include multiple intermediary conductive regions 204 that may be disposed between the die bond pad 108 and each of the wire bond pads 104, where adjacent intermediary conductive regions of the intermediary conductive regions 204 may be separated from one another by air gaps or dielectric material disposed therebetween.

A portion 105 of the solder mask 102 may be disposed directly on the intermediary conductive region 204, such that the portion 105 separates a surface of the wire bond pad 104 from the surface of the die bond pad 108. It should be understood that other portions of the solder mask 102 may be similarly disposed directly on the other intermediary conductive regions 204 of the conductive layer 208. The die 110 may be disposed over the die bond pad 108 and may be attached to (and, in one or more embodiments, electrically coupled to) the die bond pad 108 via the adhesive material 116. The adhesive material 116 may be disposed directly between an upper surface of the die bond pad 108 and a lower surface of the die 110. Excess adhesive material 206 may leak out from beneath the die 110 during a die attach step (e.g., step 308 of FIG. 3) or a subsequent curing step (e.g., step 310 of FIG. 3). Flow of the excess adhesive material 206 from the die bond pad 108 onto the surface of the wire bond pad 104 may be prevented or mitigated by the portion 105 of the solder mask 102. In this way, the solder mask 102 may protect the surface of the wire bond pad 104 from contact with (and associated contamination by) the adhesive material 116.

A wire bond 202 may have a first end that is attached to the wire bond pad 104 disposed on the substrate 101 and a second end that is attached to the wire bond pad 114 disposed on the upper surface of the die 110, such that the wire bond 202 connects the wire bond pad 104 to the wire bond pad 114. In conventional packages, contamination caused by leakage of die attach adhesive material can cause non-idealities (e.g., fish-tailing or the like) to occur at wire bond stitches at which wire bonds are bonded to contaminated wire bond pads. By preventing or mitigating leakage of the adhesive material 116 using the solder mask 102, such non-idealities may be prevented due, at least in part, to the prevention or mitigation of leakage of the adhesive material 116 by the solder mask 102.

The portion 105 of the solder mask 102 that is disposed over the intermediary conductive region 204 may have a height H1 and a width W1. In one or more embodiments, the height H1 may be in a range of around 0.01 mm to around 0.1 mm (e.g., around 0.02 mm) and the width W1 may be in a range of around 0.1 mm to around 0.2 mm (e.g., around 0.12 mm to around 0.15 mm), as non-limiting examples.

Figure 3:
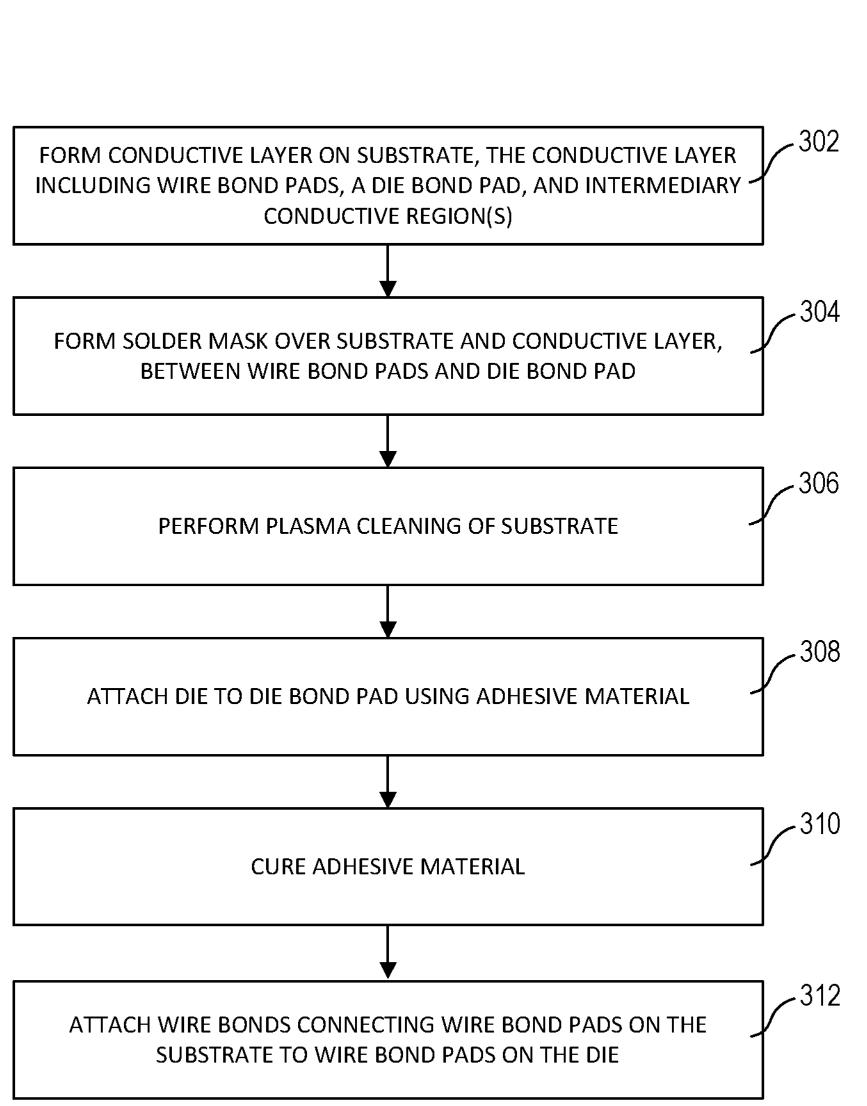
FIG. 3 shows an illustrative process flow for a method of fabrication for a package that includes a solder mask, such as the example package of FIG. 1, according to an embodiment.

FIG. 3 shows an illustrative process flow for a method 300 by which an electronic device package (e.g., an example embodiment of the electronic device package 100 of FIG. 1) may be fabricated, at least in part. The method 300 is described herein with reference to the electronic device package 100 of FIG. 1 and the view 200 of FIG. 2, and like reference numerals are used to refer to like elements. Aspects of such like elements that have already been described are not necessarily repeated here for sake of brevity.

At step 302, a conductive layer (e.g., the conductive layer 208) is formed on a surface of a substrate (e.g., the substrate 101). The conductive layer may include wire bond pads (e.g., the wire bond pads 104, 106), a die bond pad (e.g., the die bond pad 108), and one or more intermediary conductive regions (e.g., the intermediary conductive region 204) extending between the die bond pad and at least a subset of the wire bond pads (e.g., the wire bond pads 104). For example, the conductive layer may be formed via electroplating, sputtering, electron-beam evaporation, or any other suitable metal deposition process.

At step 304, a solder mask (e.g., the solder mask 102) is formed over the substrate and portions of the conductive layer (e.g., on one or more of the intermediary conductive regions of the conductive layer). The solder mask may be positioned to separate surfaces of the wire bond pads from the surface of the die bond pad, such that leakage of adhesive material (e.g., the adhesive material 116) from the die bond pad onto the wire bond pads is mitigated or prevented. For example, a portion of the solder mask (e.g., the portion 105) may be disposed directly on an intermediary conductive region (e.g., the intermediary conductive region 204) of the conductive layer. According to various embodiments, the solder mask may be formed over the substrate and the conductive layer by depositing solder mask material via curtain coating, screen printing, or electrospray deposition coating as non-limiting examples. In one or more embodiments in which the solder mask material includes photoimageable liquid ink or photoimageable dry film, the solder mask material (after deposition on the substrate) may be pre-cured, insolated (e.g., via selective ultraviolet light exposure, laser direct imaging, or the like, which may pattern the solder mask material), developed, and then cured to form the solder mask.

At step 306, the substrate may be cleaned prior to die attach (e.g., occurring at step 308 in the present example). For example, a plasma cleaning process may be used to clean the substrate prior to die attach. In conventional methods, cleaning the substrate prior to die attach in this way may be undesirable due to such cleaning increasing surface energy of the substrate, corresponding increased likelihood of die attach adhesive leakage/RBO. In contrast, in the present example, the contribution of increased surface energy from substrate cleaning to adhesive leakage/RBO may be offset by the adhesive leakage/RBO mitigation provided by the solder mask. It should be understood that this is intended to be illustrative and not limiting, and that plasma cleaning of the substrate could instead be performed after die-attach, according to one or more other embodiments.

At step 308, a die (e.g., the die 110) is attached to the die bond pad using adhesive material.

At step 310, the adhesive material is cured via exposure to high temperatures (e.g., around 175-300° C., where the curing temperature that is used may depend on the type of adhesive material used).

At step 312, wire bonds (e.g., the wire bond 202) may be attached to wire bond pads on the substrate (e.g., the wire bond pads 104, 106) and to wire bond pads on the die (e.g., the wire bond pads 114, 118) to connect the wire bond pads on the substrate to the wire bond pads on the die.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter. Furthermore, the term "amplifier" used herein should be understood to refer to a "power amplifier" unless noted otherwise.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electronic device package comprising:
- a package substrate;
- a metal layer disposed on the package substrate, the metal layer comprising:
  - a die bond pad;
  - at least one wire bond pad; and
  - a metal region connected between the die bond pad and the at least one wire bond pad; and
- a solder mask disposed over the package substrate, wherein a first portion of the solder mask is disposed directly on the metal region of the metal layer.

2. The electronic device package of claim 1, further comprising adhesive material disposed on the die bond pad, wherein the solder mask is positioned to mitigate leakage of the adhesive material from the die bond pad onto the at least one wire bond pad.

3. The electronic device package of claim 2, wherein the adhesive material comprises electrically conductive epoxy.

4. The electronic device package of claim 2, further comprising:
- a die attached to the die bond pad via the adhesive material; and
- a wire bond coupled between the at least one wire bond pad and at least one corresponding wire bond pad disposed on the die, wherein the wire bond overlaps the first portion of the solder mask.

5. The electronic device package of claim 1, wherein the first portion of the solder mask is disposed between a first surface of the die bond pad and a second surface of the at least one wire bond pad.

6. The electronic device package of claim 1, wherein the first portion of the solder mask has a width of between 0.1 mm and 0.2 mm.

7. The electronic device package of claim 1, wherein the solder mask comprises non-electrically-conductive epoxy material.

8. A package comprising:
- a package substrate;
- a metal layer formed on the package substrate, wherein the metal layer includes:
  - a die bond pad disposed on the package substrate;
  - at least one wire bond pad disposed on the package substrate and coupled to the die bond pad; and
  - a metal region that electrically connects the die bond pad to the at least one wire bond pad; and
- a solder mask having a first portion disposed between a first surface of the die bond pad and a second surface of the at least one wire bond pad, wherein the solder mask is positioned to block leakage of adhesive material from the first surface of die bond pad to the second surface of the at least one wire bond pad, and the first portion of the solder mask is disposed directly on a top surface of the metal region.

9. The package of claim 8, wherein the adhesive material comprises electrically conductive silver epoxy.

10. The package of claim 8, wherein the first portion of the solder mask has a width of between 0.1 mm and 0.2 mm.

11. The package of claim 8, further comprising a die that is attached to the die bond pad via the adhesive material.

12. The package of claim 11, further comprising at least one wire bond that connects the at least one wire bond pad to at least one corresponding wire bond pad on the die.

13. The package of claim 8, wherein the solder mask comprises non-electrically-conductive epoxy material.

* * * * *